(12) United States Patent
El-Chammas

(10) Patent No.: US 8,547,269 B2
(45) Date of Patent: Oct. 1, 2013

(54) ROBUST ENCODER FOR FOLDING ANALOG TO DIGITAL CONVERTER

(75) Inventor: Manar Ibrahim El-Chammas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 13/419,572

(22) Filed: Mar. 14, 2012

(65) Prior Publication Data
US 2013/0194120 A1 Aug. 1, 2013

Related U.S. Application Data

(60) Provisional application No. 61/597,403, filed on Feb. 10, 2012, provisional application No. 61/592,035, filed on Jan. 30, 2012.

(51) Int. Cl.
*H03M 1/12* (2006.01)
(52) U.S. Cl.
USPC ............................ 341/156; 341/155; 341/159
(58) Field of Classification Search
USPC .......................................... 341/155, 156, 159
See application file for complete search history.

(56) References Cited

U.S. PATENT DOCUMENTS

| | | | |
|---|---|---|---|
| 7,088,281 B1 * | 8/2006 | Menkus | 341/156 |
| 2002/0093447 A1 * | 7/2002 | Li | 341/158 |
| 2011/0181454 A1 * | 7/2011 | Cui et al. | 341/156 |

OTHER PUBLICATIONS

Yun Chiu and Dejan Markovic, A Study of Folding and Interpolating ADC, EECS247, Final Project Report, Fall 2000, pp. 1-6.
Michael P. Flynn and David J. Allstot, CMOS Folding A/D Converters with Current-Mode Interpolation, IEEE Journal of Solid-State Circuits, vol. 31, No. 9, Sep. 1996, pp. 1248-1257.
Shruti Oza and N. M. Devashrayee, Folding & Interpolating ADC Using Low Power Folding Amplifier, International Journal of Electronics & Communication Technology, vol. 1, Issue 1, Dec. 2010, pp. 49-54.

* cited by examiner

*Primary Examiner* — Jean B Jeanglaude
(74) *Attorney, Agent, or Firm* — Alan A. R. Cooper; W. James Brady, III; Frederick J. Telecky, Jr.

(57) ABSTRACT

An apparatus comprises: a coarse voltage level comparator that generates a coarse voltage level comparison; a folder, a fine analog to digital (ADC) comparator coupled to an output of the folder, wherein an output of the fine ADC is cyclical; an up encoder coupled to an output of the fine ADC encoder, the up encoder configured to output a first value if the cyclical output of the fine ADC is in a defined downward transition; and a fold information generator coupled to an output of the up encoder, wherein the fold information generator is configured to generate a determination as to in which fold an analog voltage occurs.

20 Claims, 5 Drawing Sheets

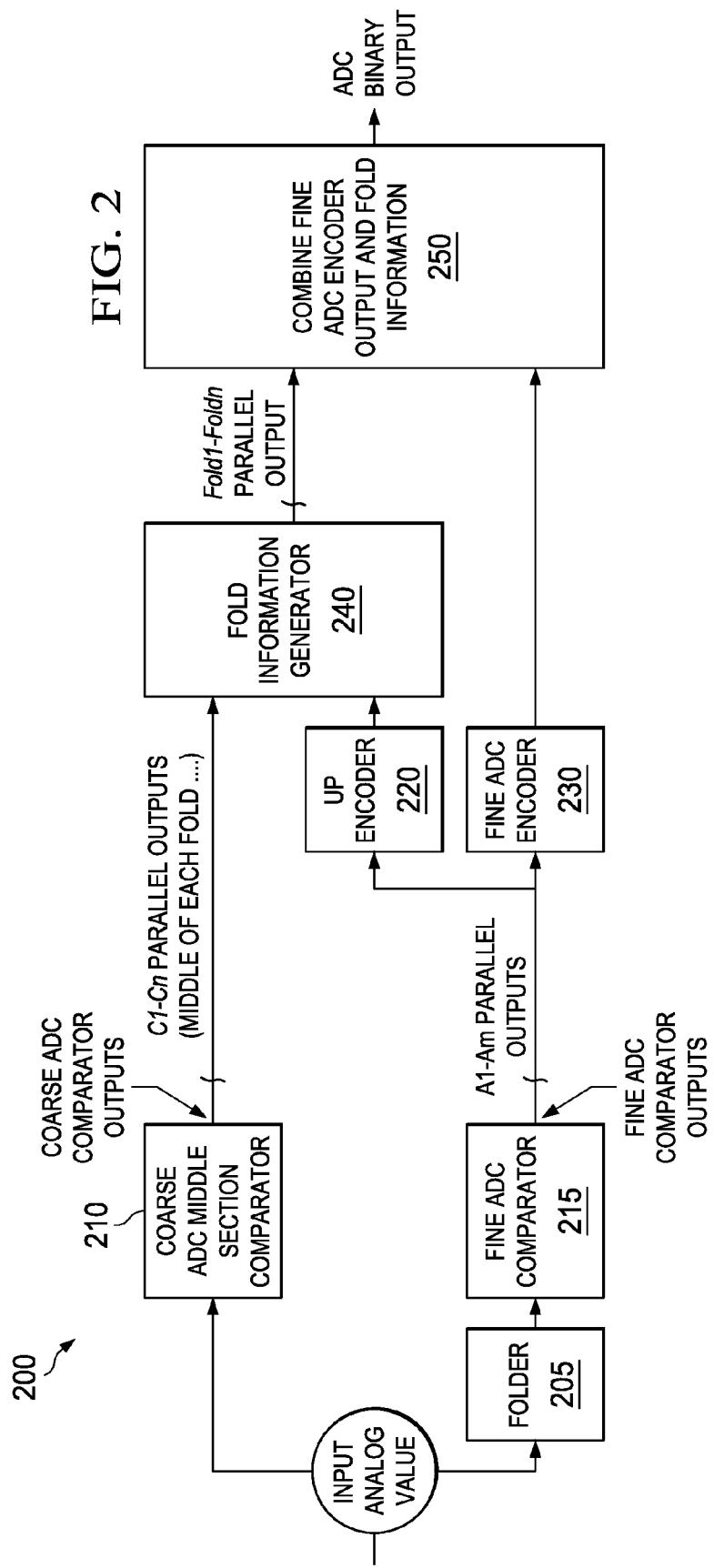

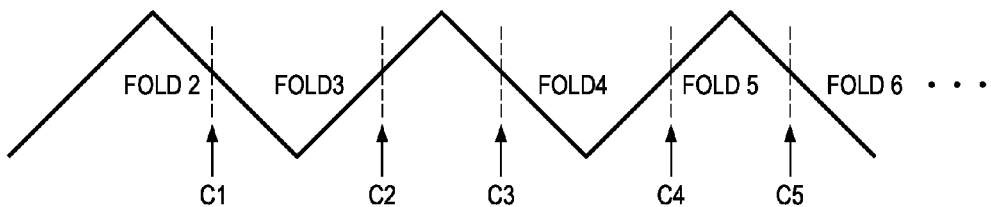
FIG. 3
| FINE ADC | UP |
|----------|----|
| 000 | 1 |
| 100 | 1 |
| 110 | 1 |
| 111 | 1 |
| 011 | 0 |
| 001 | 0 |
| 000 | 1 |
| 100 | 1 |
| 110 | 1 |
| ⋮ | ⋮ |
FIG. 4A
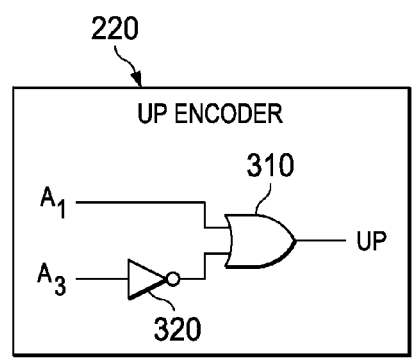
FIG. 4B
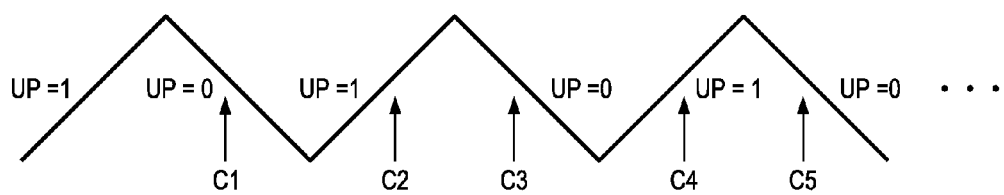
FIG. 5Ai

FIG. 5Aii

ROBUST ENCODER FOR FOLDING ANALOG TO DIGITAL CONVERTER

PRIORITY

This application claims priority to U.S. Provisional Application No. 61/592,035, filed Jan. 30, 2012, entitled "Robust Encoder for Folding ADC", which is incorporated by reference in its entirety, and to U.S. Provisional Application No. 61/597,403, filed Feb. 10, 2012, entitled "Robust Encoder for Folding ADC", which is incorporated by reference in its entirety.

TECHNICAL FIELD

This application is directed, in general, to a folding analog to digital converter (ADC), and, more specifically, to a folding ADC with a coarse voltage comparison point set in a middle of a fold.

BACKGROUND

Various employments of analog to digital converters (ADCs) benefit from using a medium resolution data converter to sample an input signal. An architecture that can implement a medium resolution data converter is a "folding" ADC, an operation of which is analogous to a flash ADC, but with a significantly smaller number of comparators.

Turning to FIG. 1A, a folding ADC 100 is illustrated. The folding ADC 100 includes a coarse ADC 110, which can be a flash ADC, and a folder 120, an output of which is coupled to a fine ADC 130. The coarse ADC 110 outputs a coarse output, and the fine ADC 130 outputs a fine output. States of the fine ADC 130, including localized minima/maxima, are included in FIG. 1B.

In general, the coarse ADC 110 specifies which section of an input signal the fine converter 130 is quantizing, as is illustrated in FIG. 1A. As is illustrated, if the fine ADC converter 130 has "N" quantization levels, and the coarse converter specifies M sections, the total number of quantization levels is N*M. For more information regarding folding ADC converters, please see "Folding & Interpolating ADC Using Low Power Folding Amplifier", by Shurit Oza, et al, Department of E.C. Engineering, KIT&RC, Kalol, India. For a, further discussion of a folding ADC, please see "Signal Folding in A/D Converters" by Pan et al, *IEEE Transactions on Circuits and Systems* –1: *Regular Papers*, Vol. 51, No. 1, January 2004, pages 3-14.

Although employment of the ADC converter 100 reduced the number of comparators when compared to a prior art flash ADC, such as through employment of a folder 175 of FIG. 1C, a low voltage, low power folding amplifier with a folding factor equal to four, and moreover decreases overall area, there are certain problems associated with prior art folding ADCs. For example, one problem is that errors in the coarse converter can create large errors in the final encoded signal. For example, an offset in the coarse ADC converter 110 can specify a wrong section, and an encoder will then output a final ADC code that greatly deviates from the actual code.

Therefore, there is a need in the art to address at least some of the issues associated with folding ADCs.

SUMMARY

A first aspect provides an apparatus, comprising: a coarse voltage level comparator that generates a coarse voltage level comparison; a folder, a fine analog to digital (ADC) comparator coupled to an output of the folder, wherein an output of the fine ADC is cyclical; an up encoder coupled to an output of the fine ADC encoder, the up encoder configured to output a first value if the cyclical output of the fine ADC is in a defined downward transition; and a fold information generator coupled to an output of the up encoder, wherein the fold information generator is configured to generate a determination as to in which fold an analog voltage occurs.

A second aspect provides an apparatus, comprising: a coarse voltage level comparator that generates a coarse voltage level comparison, a folder; a fine analog to digital (ADC) comparator coupled to an output of the folder, wherein an output of the fine ADC is cyclical; an up encoder coupled to an output of the fine ADC encoder, the up encoder configured to output a first value if the cyclical output of the fine ADC is in a defined downward transition; and a fold information generator coupled to an output of the up encoder, wherein the fold information generator is configured to generate a determination as to in which fold an analog voltage occurs, the fold information generator comprising: a plurality of logical combiners; an output from the up encoder coupled to an input of each of the plurality of logical combiners; a different combination of output lines from the coarse ADC comparator coupled into each of the plurality of logic combiners, wherein the logic combiners output a fold information as to which fold the analog signal corresponds as determined by a combination of: a) the output from the up encoder; and b) each of the different combination of output lines from the coarse ADC comparator.

A third aspect provides an apparatus, comprising: a coarse voltage level comparator that generates a coarse voltage level comparison, a folder, a fine analog to digital (ADC) comparator coupled to an output of the folder, wherein an output of the fine ADC is cyclical; an up encoder coupled to an output of the fine ADC encoder, the up encoder configured to output a first value if the cyclical output of the fine ADC is in a defined downward transition; and a fold information generator coupled to an output of the up encoder, wherein the fold information generator is configured to generate a determination as to in which fold an analog voltage occurs, the fold information generator comprising: a plurality of logical combiners; an output from the up encoder coupled to an input of each of the plurality of logical combiners; a different combination of output lines from the coarse ADC comparator coupled into each of the plurality of logic combiners, wherein the logic combiners output a fold information as to which fold the analog signal corresponds as determined by a combination of: a) the output from the up encoder; and b) each of the different combination of output lines from the coarse ADC comparator; and a combiner coupled to an output of the fine ADC encoder and the fold encoder generator.

BRIEF DESCRIPTION OF THE DRAWINGS

Reference is now made to the following descriptions:

FIG. 2 illustrates a block diagram of a folding ADC constructed according to the principles of the present Application;

FIG. 3 is an illustration of relative voltage comparison points of the coarse ADC converter of FIG. 2, and how they map to the folds of FIG. 2;

FIG. 4A is a table of cyclical values employed by an up encoder of FIG. 2;

FIG. 4B is a logic diagram of the up encoder of FIG. 2 that can use the table of cyclical values of FIG. 4A;

FIG. 5Ai is a logic diagram of a trigger of a combination of relative voltage comparison points of the coarse ADC converter of FIG. 2 and up signals generated of FIG. 4B;

FIG. 5Aii is an illustration of logic used to 1 to 1 map and define which fold a sampled analog signal becomes.

DETAILED DESCRIPTION

Figure 1A:
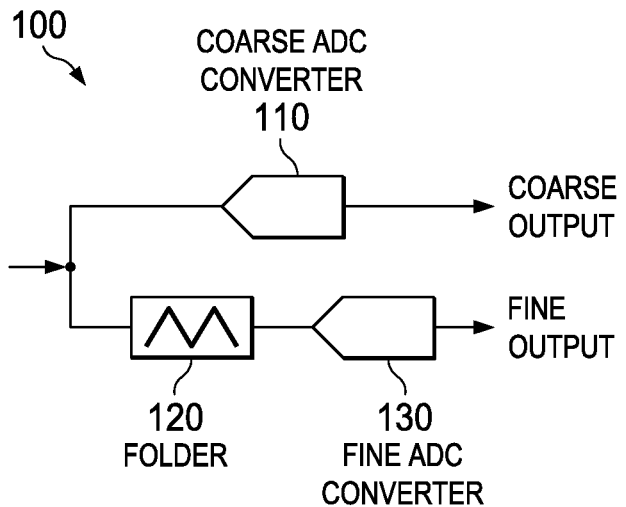
FIG. 1A illustrates a block diagram of a prior art folding analog to digital converter (ADC)
Figure 1B:
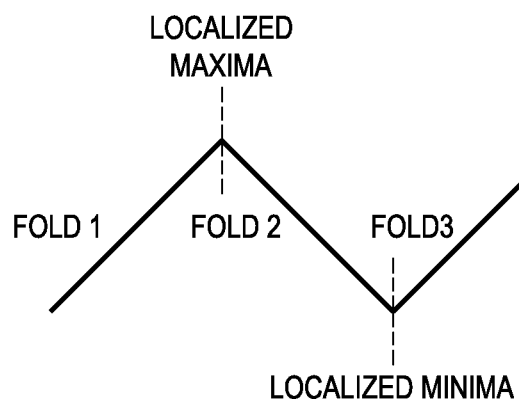
FIG. 1B illustrates a prior art graph of a trigger of a change of an output of the prior art folding ADC of FIG. 1A.
Figure 1C:
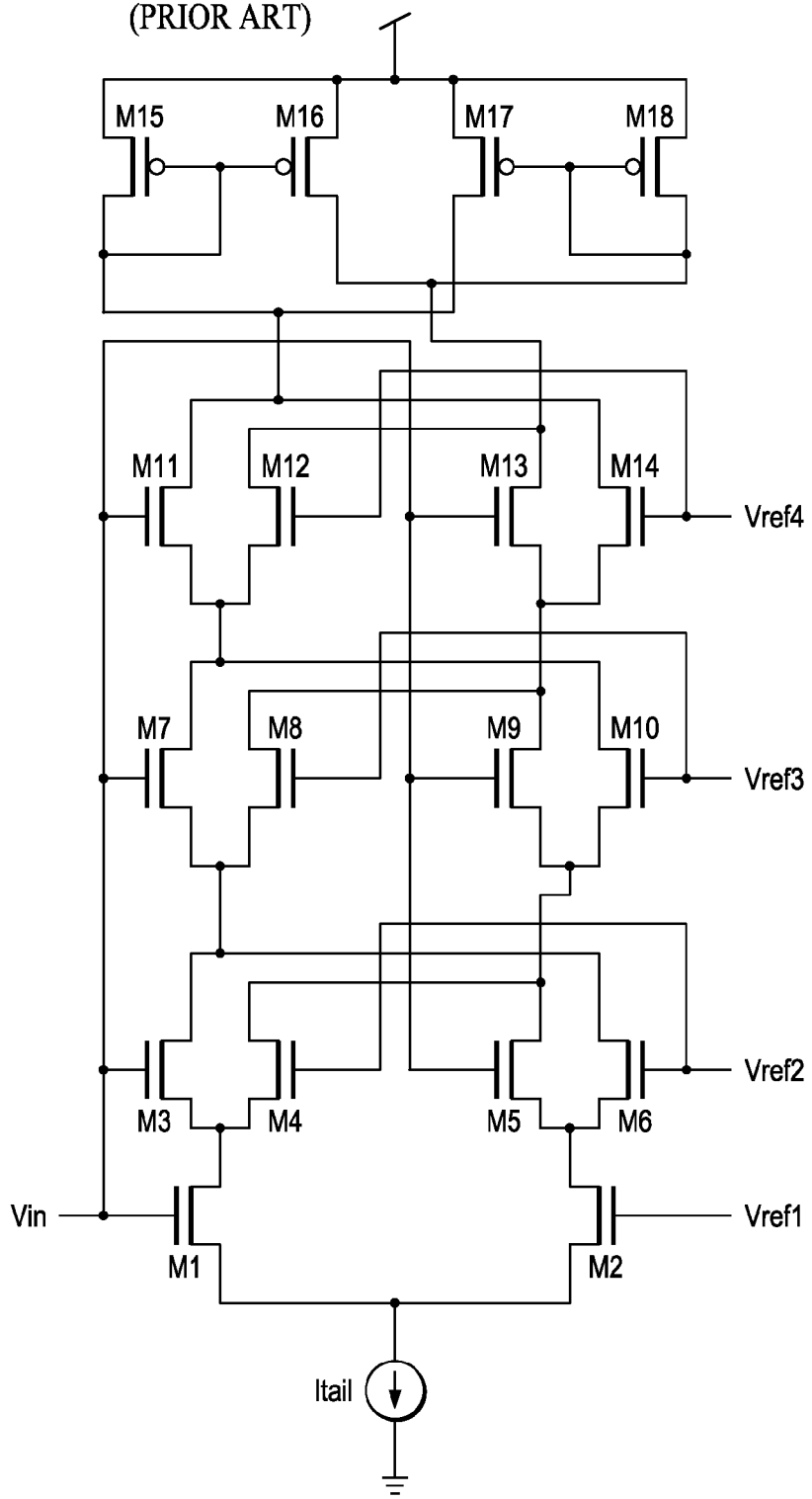
FIG. 1C illustrates a prior art folder of an ADC.

Turning to FIG. 2, illustrated is a folding ADC with comparisons in a middle of a section 200 constructed according to the principles of the present Application. Generally, in FIG. 2, an input analog signal is divided in a number of sections. A folder circuit 205 folds the input signal to correspond to these sections, such that the folder output is quantized by a fine ADC comparator 215. A coarse comparator 210 coarsely quantizes the input signals in any location within the sections, as opposed to on the section edges, as was performed in the prior art. Moreover, the coarse ADC middle section comparator does not separate sections of the analog input signal, unlike the prior art.

For more information on folders and folding, please see "Signal Folding in A/D Converters" by Pan et al, *IEEE Transactions on Circuits and Systems –1: Regular Papers*, Vol. 51, No. 1, January 2004, pages 3-14, which is hereby incorporated by reference in its entirety. In an alternative approach, BJTs instead of MOSFETs can be used as input pairs of a folder.

In FIG. 2 an input analog value is received. The input analog value is then conveyed, in parallel, to a folder 205, and coarse ADC middle section comparator 210. The folder 205 creates a fold, and then conveys this to the fine ADC comparator 215. An output of the fine ADC comparator 215 is coupled in parallel to an up encoder 220 and a fine ADC encoder 230. The coarse ADC middle fold comparator 210 and the up encoder 220 are both coupled into a fold generator information 240. The coarse ADC middle fold comparator 210 can be a flash comparator. The fine ADC encoder 230 and the Fold Information Generator 240 are both coupled into a combiner 250, which then generates an ADC binary output. The combiner can be, for example, a weighted binary output that weights a given fold with a binary value, and then adds a value output of the fine ADC encoder.

The fine ADC encoder 230 outputs a cyclical output. For more information on fine ADC cyclical outputs, please see "CMOS Folding A/D Converters with Current-Mode Interpolation" by Michael P. Flynn, et al. IEEE Journal of Solid-State Circuits, Vol. 31, No. 9, September 1996, which is hereby incorporated by reference in its entirety.

Turning briefly to FIG. 3, the ADC middle fold comparator 210, instead of being designed to trigger off the local maxima and minima, as in the prior art, is instead calibrated, such as by voltage levels, to trigger within a section, such as substantially in a middle of a section, such as in fold 2, fold 3, fold 4, fold 5, and so on, thereby avoiding errors pertaining to voltage comparisons that occur at folds. These voltage levels can be implemented with employment of a flash ADC; however, unlike prior art ADCs in prior art flash ADCs, the voltage levels are set in the middle of the folds, rather at the apex or antonym of the folds.

Therefore, within the up encoder 220 of FIG. 2, a truth table, such as found in FIG. 4A, can be encoded. In the up encoder 220, the up encoder 220 can identify a fold by taking advantage of a cyclical nature of a fine ADC output.

In the up encoder 220, every two consecutive folds are differentiated with the function $UP=(F_{last})'+F_{first}$, received from the fine comparator ADC 215. Within the up encoder 220, the up encoder 220 looks at two comparators within the fine ADC: the comparator with the lowest reference voltage ($F_{first}$) and the comparator with the highest reference voltage ($F_{last}$). Therefore, $F_{first}$ is the first signal in the comparator array (or the one with the lowest reference value), and does not refer to the first comparator signal received.

For example, for a 2-bit fine ADC 215 (3 comparators), the fine ADC outputs, and the corresponding output of the up encoder 220, are shown in FIG. 4A.

The table of FIG. 4A corresponds to different analog input values. For one illustrative example, assume that an input ranges from 0 to 1. As it increases, the folding circuit creates folds, which the fine ADC then quantizes. The column with the fine ADC output shows what the comparator outputs would be, for one example, if there were three comparators. The first column in the fine ADC column corresponds to the comparator with the lowest reference voltage, and the last to the comparator with the highest reference voltage. As the fine ADC comparator 215 outputs are traversed, the cyclical nature in notable. The UP signal corresponds to the direction of the fine ADC. In the first four entries, the fine ADC increases from 0 to 3, corresponding to an UP=1. In the next three entries, the fine ADC decreases from 2 to 1, corresponding to an UP=0.

FIG. 4B illustrates some example logic of the Up encoder 220. As is illustrated, a value A1 and A3 are the output of the first comparator, and last comparator, and is inverted by an inverter 320, and then conveyed into the OR gate 310, where $A_1$ is the first row and $A_3$ is the last row. In other words, 310 is negative (i.e., the fold is a down sloping fold, if an up value is zero. Otherwise, it is assumed that the fold is a, up-rising fold.)

FIG. 5Ai, illustrates, therefore, that the comparators in the coarse ADC 210 can be used to separate UP signals between alternating or consecutive folds. These UP signals can be separated by placing a coarse comparator voltage comparison point between two identical up signals. Although these can be practically anywhere within these folds, in a further aspect, these voltage signals comparisons are substantially in a middle of a fold.

FIG. 5Aii illustrates, therefore, logic that is used to define which section the signal is. With this implementation of the logic, the comparator transitions in the coarse ADC 210 do not need to be precise; their reference voltage can vary as long as it falls within the correct fold, which can greatly relax any offset requirements.

Figure 5B:
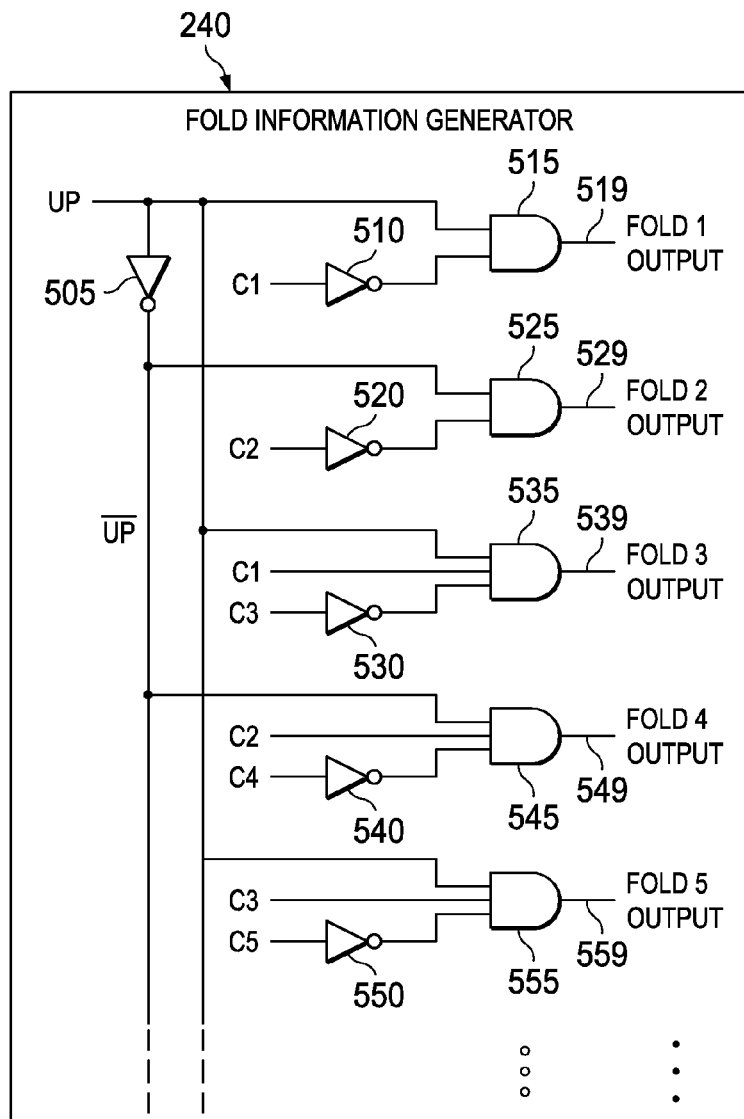
FIG. 5B is an illustration of logic used to define which fold a sampled analog signal becomes.

For example, in the third section, C1=1 and C3=0, as seen in FIG. 5B, since the signal is between the two. However, the UP signal is 1. Therefore, the fold information generator 240 outputs that the $fold_3=1$, whereas $fold_x=0$ for all other folds.

FIG. 5B illustrates one example of circuitry of the fold information generator 240. In the fold generator 240, an up signal from the UP encoder 220, wherein the signal is both used as an UP signal, and inverted by an inverter 505 into a UP' signal. Outputs of the coarse ADC middle fold comparator C1-Cn are variously coupled through inverters 510-550, although further inverters can be used. Also, alternating UP and UP' values are conveyed as a first value to encoder AND gates 515-535.

In the fold information generator 240, only one the output of $Fold_1$ output 519, $Fold_2$ output 529, $Fold_3$ output 539, $Fold_4$ output 549, and $Fold_5$ output 559, output a positive logic value, thereby identifying to which fold a given analog signal belongs. The positive fold value, along with an output of the find ADC value encoder 230, is then employed by the combiner 250 to output an ADC binary output.

Those skilled in the art to which this application relates will appreciate that other and further additions, deletions, substitutions and modifications may be made to the described embodiments.

What is claimed is:

1. An apparatus, comprising:
a coarse voltage level comparator that generates a coarse voltage level comparison;
a folder;
a fine analog to digital (ADC) comparator coupled to an output of the folder, wherein an output of the fine ADC is cyclical;
an up encoder coupled to an output of the fine ADC encoder, the up encoder configured to output a first value if the cyclical output of the fine ADC is in a defined downward transition; and
a fold information generator coupled to an output of the up encoder, wherein the fold information generator is configured to generate a determination as to in which fold an analog voltage occurs.

2. The apparatus of claim 1, comprising wherein the fine ADC comparator outputs either a high logic value or a low logic value.

3. The apparatus of claim 1, and wherein an inverter is coupled to a third output, and an OR gate is coupled to both the first and third output within the up encoder, to generate an up value.

4. The apparatus of claim 1, wherein a voltage comparison of the voltage level comparator occurs substantially within a center of a fold.

5. The apparatus of claim 1, further comprising a fine encoder coupled to the fine ADC comparator.

6. The apparatus of claim 5, further comprising a combiner coupled to an output of both the fine ADC encoder and the fold encoder generator.

7. The apparatus of claim 1, the fold information generator comprising:
a plurality of logical combiners;
an output from the up encoder coupled to an input of each of the plurality of logical combiners;
a different combination of output lines from the coarse ADC comparator coupled into each of the plurality of logic combiners,
wherein the logic combiners output a fold information as to which fold the analog signal corresponds as determined by a combination of:
a) the output from the up encoder; and
b) each of the different combination of output lines from the coarse ADC comparator.

8. The apparatus of claim 1, further comprising:
an inverter coupled to the output of the up encoder; and wherein alternating logical element are coupled to a cathode and an anode of the inverter, respectively.

9. The apparatus of claim 8, wherein the logical combiners include AND gates.

10. An apparatus, comprising:
a coarse voltage level comparator that generates a coarse voltage level comparison;
a folder;
a fine analog to digital (ADC) comparator coupled to an output of the folder, wherein an output of the fine ADC is cyclical;
an up encoder coupled to an output of the fine ADC encoder, the up encoder configured to output a first value if the cyclical output of the fine ADC is in a defined downward transition; and
a fold information generator coupled to an output of the up encoder, wherein the fold information generator is configured to generate a determination as to in which section an analog voltage occurs, the fold information generator comprising:
a plurality of logical combiners;
an output from the up encoder coupled to an input of each of the plurality of logical combiners;
a different combination of output lines from the coarse ADC comparator coupled into each of the plurality of logic combiners,
wherein the logic combiners output a fold information as to which fold the analog signal corresponds as determined by a combination of:
a) the output from the up encoder; and
b) each of the different combination of output lines from the coarse ADC comparator.

11. The apparatus of claim 10, wherein a voltage comparison of a voltage comparator occurs substantially at a center of a fold.

12. The apparatus of claim 10, comprising wherein the find ADC comparator outputs a first logic value a second logic value and a third logic value in parallel.

13. The apparatus of claim 10, wherein the fine ADC converter has a first output, a second output, and a third output corresponding to a least significant digit, and wherein an inverter is coupled to a third output, and an OR gate is coupled to both the first and third output within the up encoder, to generate an up value.

14. The apparatus of claim 10, further comprising a fine encoder coupled to the fine ADC comparator.

15. The apparatus of claim 14, further comprising a combiner coupled to an output of both the fine ADC encoder and the fold encoder generator.

16. An apparatus, comprising:
a coarse voltage level comparator that generates a coarse voltage level comparison;
a folder;
a fine analog to digital (ADC) comparator coupled to an output of the folder, wherein an output of the fine ADC is cyclical;
an up encoder coupled to an output of the fine ADC encoder, the up encoder configured to output a first value if the cyclical output of the fine ADC is in a defined downward transition; and
a fold information generator coupled to an output of the up encoder, wherein the fold information generator is configured to generate a determination as to in which fold an analog voltage occurs, the fold information generator comprising:
a plurality of logical combiners;
an output from the up encoder coupled to an input of each of the plurality of logical combiners;
a different combination of output lines from the coarse ADC comparator coupled into each of the plurality of logic combiners,
wherein the logic combiners output a fold information as to which fold the analog signal corresponds as determined by a combination of:
a) the output from the up encoder; and
b) each of the different combination of output lines from the coarse ADC comparator; and a combiner coupled to an output of the fine ADC encoder and the fold encoder generator.

17. The apparatus of claim 16, further comprising:
an inverter coupled to the output of the up encoder; and
wherein alternating logical element are coupled to a cathode and an anode of the inverter, respectively.

18. The apparatus of claim 16, wherein the logical combiners include AND gates.

19. The apparatus of claim 16, further comprising a fine encoder coupled to the fine ADC comparator.

20. The apparatus of claim 16, further comprising a combiner coupled to an output of both the fine ADC encoder and the fold encoder generator.

* * * * *